(12) United States Patent
Ando et al.

(10) Patent No.: US 10,930,762 B2
(45) Date of Patent: Feb. 23, 2021

(54) MULTIPLE WORK FUNCTION NANOSHEET FIELD EFFECT TRANSISTOR USING SACRIFICIAL SILICON GERMANIUM GROWTH

(71) Applicant: INTERNATIONAL BUSINESS MACHINES CORPORATION, Armonk, NY (US)

(72) Inventors: Takashi Ando, Tuckahoe, NY (US); Choonghyun Lee, Rensselaer, NY (US); Pouya Hashemi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 36 days.

(21) Appl. No.: 15/917,089

(22) Filed: Mar. 9, 2018

(65) Prior Publication Data

US 2019/0280107 A1    Sep. 12, 2019

(51) Int. Cl.
  *H01L 29/66*        (2006.01)
  *H01L 27/092*       (2006.01)
  *H01L 21/8238*      (2006.01)
  *H01L 29/78*        (2006.01)
  *H01L 29/06*        (2006.01)
  (Continued)

(52) U.S. Cl.
  CPC ............ *H01L 29/66795* (2013.01); *H01L 21/823807* (2013.01); *H01L 21/823821* (2013.01); *H01L 21/823828* (2013.01); *H01L 27/092* (2013.01); *H01L 27/0924* (2013.01); *H01L 29/0673* (2013.01); *H01L 29/42392* (2013.01); *H01L 29/513* (2013.01); *H01L 29/66439* (2013.01); *H01L 29/7856* (2013.01); *H01L 29/78696* (2013.01)

(58) Field of Classification Search
  CPC ......... H01L 29/42392; H01L 29/66545; H01L 29/0673; H01L 29/78696; H01L 29/66439
  See application file for complete search history.

(56) References Cited

U.S. PATENT DOCUMENTS 7,601,570 B2   10/2009   Damlencourt
8,422,273 B2    4/2013   Chang et al.
(Continued)

OTHER PUBLICATIONS

Lin, C.H. et al., "High performance 14nm SOI FinFET CMOS technology with 0.0174 μm 2 embedded DRAM and 15 levels of Cu metallization" International Electron Devices Meeting, IEDM (Dec. 2014) pp. 3.8.1-3.8.3.

*Primary Examiner* — Tony Tran
(74) *Attorney, Agent, or Firm* — Tutunjian & Bitetto, P.C.; Douglas Pearson

(57) ABSTRACT

A method of forming a semiconductor device that includes forming a stack of nanosheets composed of a semiconductor material; and forming a sacrificial layer of a work function adjusting material on the semiconductor material of the stack of nanosheets. In a following step, the work function adjusting material is mixed into the semiconductor material on at least a channel surface of nanosheets. The sacrificial layer is removed. An interfacial oxide layer is formed including elements from the semiconductor material and the work function adjusting layer on said at least the channel surface of the stack of nanosheets. A gate structure including a gate dielectric is formed on the interfacial oxide that is present on the channel surface of the nanosheets.

6 Claims, 10 Drawing Sheets

(51) Int. Cl.
    *H01L 29/786*     (2006.01)
    *H01L 29/51*     (2006.01)
    *H01L 29/423*     (2006.01)

(56) References Cited

U.S. PATENT DOCUMENTS

| | | |
|---|---|---|
| 9,331,204 B2 | 5/2016 | Lue |
| 9,490,323 B2 | 11/2016 | Rodder et al. |
| 9,536,794 B2 | 1/2017 | Chang et al. |
| 9,570,609 B2 | 2/2017 | Obradovic et al. |
| 9,608,059 B2 | 3/2017 | Cappellani et al. |
| 9,653,537 B1 | 5/2017 | Jagannathan et al. |
| 2015/0021699 A1 | 1/2015 | Ando et al. |
| 2017/0005190 A1 | 1/2017 | Chang et al. |
| 2017/0263705 A1 | 9/2017 | Cheng et al. |
| 2018/0308986 A1 | 10/2018 | Chao et al. |

MULTIPLE WORK FUNCTION NANOSHEET FIELD EFFECT TRANSISTOR USING SACRIFICIAL SILICON GERMANIUM GROWTH

BACKGROUND

Technical Field

The present disclosure relates to semiconductor devices, and more particularly to semiconductor devices including channel regions integrated within nano-sheets.

Description of the Related Art

With the continuing trend towards miniaturization of integrated circuits (ICs), there is a need for transistors to have higher drive currents with increasingly smaller dimensions. The use of non-planar semiconductor devices such as, for example, nanowire and nano-sheet transistors may be the next step in the evolution of complementary metal oxide semiconductor (CMOS) devices.

SUMMARY

The methods and structures provided herein provide for effective threshold voltage adjustments by the integration of a sacrificial layer including work function adjusting elements that intermix those work function adjusting elements with the semiconductor material of the channel portion of the nanosheets on which the sacrificial layer is formed. After the sacrificial layer is removed, an interfacial oxide is formed on the channel portion of the nanosheets that now includes the intermixed work function adjusting elements. The interfacial oxide including the work function adjusting elements provides a threshold voltage adjustment to the semiconductor device having a gate structure including the interfacial oxide with the work function adjusting elements. In some embodiments, the sacrificial layer is silicon germanium (SiGe), and the work function adjusting element is germanium (Ge) incorporated into an interfacial oxide that is silicon oxide based. The use of the sacrificial layer to provide for work function adjusting elements, and therefore different threshold voltages based upon the work function adjusting elements, may be employed in at least four different that can be simultaneously practiced on a same supporting substrate.

The four cases can include the use of a sacrificial layers including work function adjusting elements, e.g., germanium (Ge), to provide a threshold voltage adjustments to n-type metal oxide semiconductor (NMOS) type devices; n-type metal oxide semiconductor (NMOS) type devices formed without the use of sacrificial layers including work function adjusting elements; work function adjusting elements, e.g., germanium (Ge), to provide a threshold voltage adjustments to p-type metal oxide semiconductor (PMOS) type devices; and p-type metal oxide semiconductor (PMOS) type devices formed without the use of sacrificial layers including work function adjusting elements. The incorporation of the work function adjusting elements for a conductivity type, e.g., n-type or p-type device, into the interfacial oxide layer of the gate structure of the devices results in a threshold voltage shift, e.g., 200 mV, when compared to a substantially similar structured same conductivity type device that does not include the work function adjusting elements. The four different cases can be simultaneously provided on the same semiconductor substrate.

In one embodiment, the present disclosure provides a suspended channel field effect transistor (FET), i.e., nanosheet, having work function adjustments. The method may include forming a stack of nanosheets composed of a semiconductor material. The method may further include forming a sacrificial layer of a work function adjusting material on the semiconductor material of the stack of nanosheets. Intermixing the work function adjusting material into the semiconductor material on at least a channel surface of nanosheets in said stack of nanosheets. Removing the sacrificial layer of a work function adjusting material. Forming an interfacial oxide including elements from the semiconductor material and the work function adjusting layer on said at least the channel surface of the nanosheets. Forming a gate structure including a gate dielectric on the interfacial oxide that is present on the channel surface of the nanosheets.

In another embodiment of the present disclosure, the method may begin with providing a first stack of nanosheets having a silicon containing surface on a first region of a substrate, and a second stack of nanosheets in a second region of the substrate. A sacrificial layer of a work function adjusting material is formed on a channel region of the first and second stacks of nanosheets. The work function adjusting material is mixed into the semiconductor material of at least a channel surface of nanosheets in said first and second stacks of nanosheets to provide a first and second reacted layer each comprising work function adjusting material. The second reacted layer is removed from the second stacks of nanosheets. A first gate structure is formed on the first stack on nanosheets and a second gate structure on the second stack of nanosheets.

In another aspect, an electrical device is provided that includes a stack of nanosheets composed of a silicon containing semiconductor material, a gate structure present on a channel portion of the stack of nanosheets, and source and drain regions that are present on source and drain region portions of the stack of nanosheets. The gate structure includes an interface oxide dielectric layer that include germanium work function adjusting elements in combination with elements from the surface of the stack of nanosheets, wherein the germanium work function adjusting elements introduce a shift to the threshold voltage of the electrical device. The gate structure also includes a high-k gate dielectric atop the interfacial oxide dielectric layer, and a gate electrode atop the high-k gate dielectric.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION

Figure 1A:
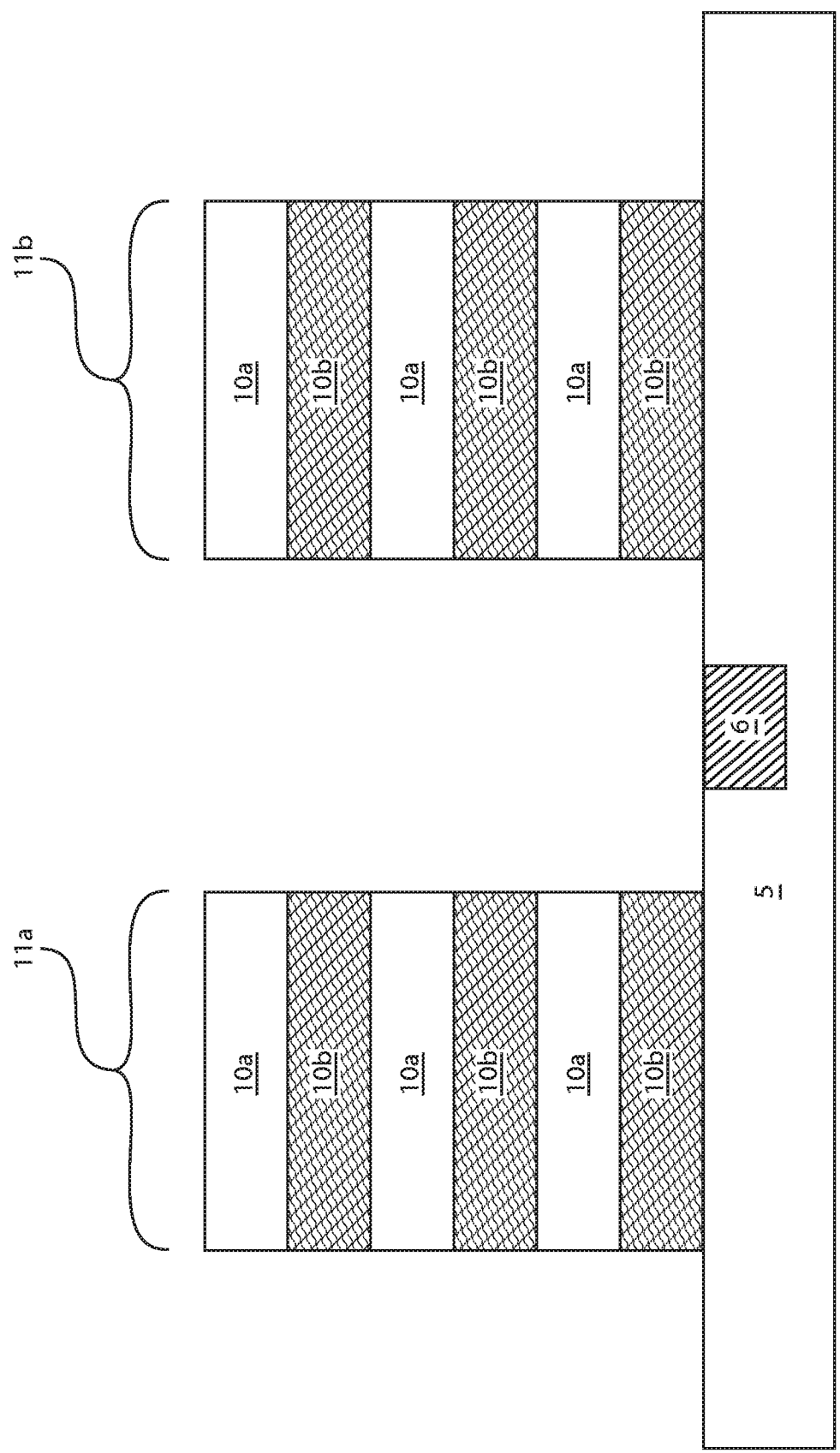
FIG. 1A is a side cross-sectional view depicting the channel region of two stacks of nanosheets on a same supporting substrate following removal of a sacrificial gate structure as part of a gate last process flow, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one aspect, embodiments of the present disclosure describe nano-sheet transistors. Nanosheet MOSFET is a candidate for future complementary metal oxide semiconductor (CMOS) technology. Multiple Work Function gate stacks can be advantageous to achieve CMOS technology with multiple threshold voltages (Vt) on fully depleted channel architectures (e.g. nanosheet architectures) to take advantage of higher mobility and smaller device variability due to absence of channel doping. Multiple work function schemes may include patterning steps post high-k deposition to pattern workfunction setting metal or dipole formation elements (e.g. La, Al). For nanosheet devices, the space between sheets is not large enough to perform such patterning steps post high-k deposition. Thus, there is no known method/structure to achieve multiple work functions for nanosheet devices on a same processing surface.

In some embodiments, the methods and structures of the present disclosure overcome the aforementioned difficulties by introducing work function adjusting elements into the interfacial oxide of the gate structures that are formed on the channel region portions of the nanosheets. In some embodiments, the work function adjusting elements are provided by germanium (Ge). For example, forming a sacrificial germanium containing semiconductor materials on the channel region surfaces of the nanosheets, annealing the sacrificial germanium containing semiconductor materials to diffuse the work germanium containing work function adjusting elements into the nanosheets, and then removing the sacrificial germanium containing semiconductor materials provides for nanosheets having a channel surface with germanium containing work function adjusting elements present therein. In some embodiments, the sacrificial germanium containing semiconductor materials may include high germanium Ge-content, i.e., greater than 35 wt. % germanium (Ge), and in some examples greater than 40 wt. % germanium (Ge), SiGe. Removal of the sacrificial germanium containing semiconductor materials form the silicon containing surface, e.g., silicon (Si) surface, of the nanosheets leaves a reacted layer and subsequent formation of gate dielectrics on the channel surfaces, e.g., high-k gate dielectrics, may result in a fraction of germanium (Ge), and/or other elements from the sacrificial germanium containing semiconductor materials to be included in the oxide based interfacial layer between the channel and the gate dielectric. In some embodiments, the inclusion of germanium work function adjusting elements into a silicon oxide interfacial layer underlying a hafnium containing high-k gate dielectric can provide up to 200 mV of Vt shift without causing degradation in the interface quality of the nanosheets. In some embodiments, the silicon oxide interface layer is SiO$_2$ based. Moreover, this methods of the present disclosure do not take any additional space between nanosheets with the introduction of the germanium work function adjusting elements.

In some embodiments, the present disclosure provides for the formation of nanosheet semiconductor devices with a silicon (Si) channel for nFET and pFET type conductivities. The interfacial layer includes Ge in High Vt nFET and Low Vt pFET areas, whereas it is absent in Regular Vt areas. In some embodiments, the process flow for providing the nanosheet semiconductor devices includes selective growth and removal of a high germanium content (HGC) silicon germanium (SiGe) layer after formation of silicon (Si) channel nanosheets for high voltage (Vt) n-type Field Effect Transistor (nFET) and low voltage (Vt) p-type Field Effect Transistors (pFET) areas. In other embodiments, the high germanium content (HGC) silicon germanium (SiGe) layer can be positioned between silicon layers in a stack of materials for the formation of nanosheets. The high germanium content (HGC) silicon germanium (SiGe) layer may be removed selectively to the silicon layer, in which the silicon layers remain to provide channel portions of nanosheet devices. In this embodiment, the reacted surface layer that is formed by the interaction of the high germanium content (HGC) silicon germanium (SiGe) layer and the silicon layer remains when a threshold voltage shift is described from the nanosheet stack; and when a threshold voltage shift is not desired, the reacted surface layer is removed from the silicon channel. Further details regarding the method and structures of the present disclosure are now described with reference to FIG. 1-9.

Referring to FIGS. 1-9, the methods and structures provided herein provide for effective threshold voltage adjustments by the integration of a sacrificial layer including work function adjusting elements that intermix those work function adjusting elements with the semiconductor material of the channel portion of the nanosheets on which the sacrificial layer is formed. After the sacrificial layer is removed, an interfacial oxide 17a is formed on the channel portion of the nanosheets 10a that now includes the intermixed work function adjusting elements. The interfacial oxide 17a including the work function adjusting elements provides a threshold voltage adjustment to the semiconductor device having a gate structure 20a including the interfacial oxide 17a with the work function adjusting elements. In some embodiments, the sacrificial layer 15 is silicon germanium (SiGe), and the work function adjusting element is germanium (Ge) incorporated into an interfacial oxide 17a that is silicon oxide based. The use of the sacrificial layer 15 to provide for work function adjusting elements, and therefore different threshold voltages based upon the work function adjusting elements, may be employed in at least four different that can be simultaneously practiced on a same supporting substrate.

The four cases can include the use of a sacrificial layers including work function adjusting elements, e.g., germanium (Ge), to provide a threshold voltage adjustments to n-type metal oxide semiconductor (NMOS) type devices; n-type metal oxide semiconductor (NMOS) type devices formed without the use of sacrificial layers including work function adjusting elements; work function adjusting elements, e.g., germanium (Ge), to provide a threshold voltage adjustments to p-type metal oxide semiconductor (PMOS) type devices; and p-type metal oxide semiconductor (PMOS) type devices formed without the use of sacrificial layers including work function adjusting elements. The incorporation of the work function adjusting elements for a conductivity type, e.g., n-type or p-type device, into the interfacial oxide layer of the gate structure of the devices results in a threshold voltage shift, e.g., 200 mV, when compared to a substantially similar structured same conductivity type device that does not include the work function adjusting elements. The four different cases can be simultaneously provided on the same semiconductor substrate 5. For the purposes of simplicity, only two stacks of nanosheets 11a, 11b are depicted in FIGS. 1-9.

As noted above, all four different cases, and any combination of any of the four noted different cases, can be implanted on the same substrate 5. For the purposes of simplicity, the first stack 11a of nanosheets 10a, 10b can provide the description for providing threshold voltage shifts to p-type and/or n-type semiconductor devices employing the interfacial oxide layer 17a including the work function adjusting elements introduced by the sacrificial layers 15 including work function adjusting elements, e.g. germanium (Ge). The semiconductor devices formed with the process flow including interfacial layer includes Ge are the High Vt nFET and Low Vt pFET areas of the substrate 5. The second stack 11b of nanosheets 10a, 10b is processed to provide channel regions having associated gate structures that do not include the interfacial oxide layers having the work function adjusting layers. The semiconductor devices formed using the second stack 11b of nanosheets 10a, 10b may be n-type and/or p-type devices that do not include threshold voltage adjustments. These may be referred to as n-type and/or p-type devices having regular threshold voltages. To summarize, the semiconductor devices formed using the interfacial layer includes work function adjusting elements, such as germanium (Ge), in high threshold voltage (Vt) nFETs, and low threshold voltage (Vt) pFET areas, whereas the work function adjusting elements are not present in the gate structures of nFETs and/or pFETs in regular threshold voltage (Vt) areas.

Figure 1B:
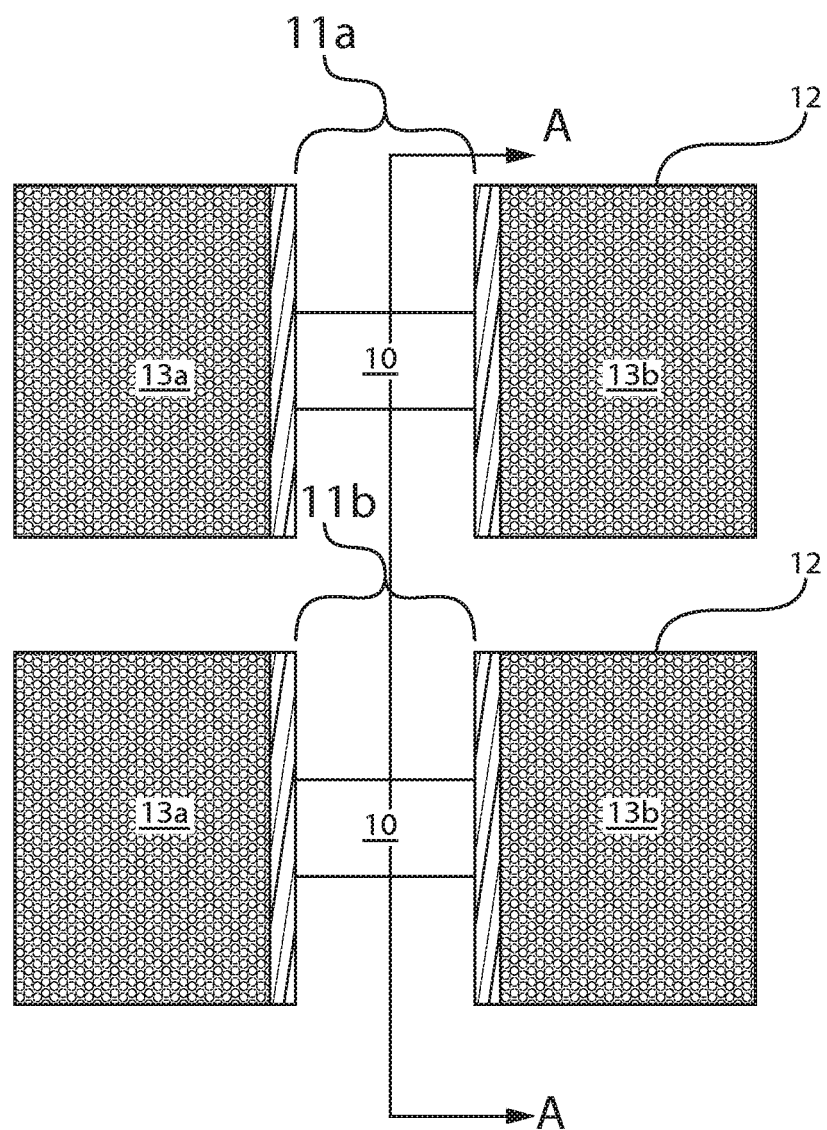
FIG. 1B is a top down view of the structure depicted in FIG. 1A.

FIGS. 1A and 1B depict the channel region of two stacks 11a, 11b of nanosheets 10a, 10b on a same supporting substrate 5 following removal of a sacrificial gate structure, as part of a gate last process flow. FIG. 1A is a cross-section along section line A-A of FIG. 1B, and illustrates the channel region of the devices being formed for each of the first and second stacks of nanosheets 11a, 11b.

In some embodiments, the substrate 5 may be composed of a supporting material, such as a semiconductor material, e.g., silicon, or dielectric material, such as silicon oxide or silicon nitride.

The stacks 11a, 11b of nanosheets 10a, 10b are formed from stacks of layered semiconductor materials. The stacks of the at least two semiconductor materials are typically composed of two alternating materials. The channel providing sheets 10a of the stacks 11a, 11b may be composed of a first semiconductor material. The sacrificial sheets 10b of the stacks 11a, 11b may be composed of a second semiconductor material that can be removed selectively to the first semiconductor material. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1. For example, the first semiconductor material that is present on the substrate 5 for each of the stacks 11a, 11b may be composed of a germanium free silicon containing semiconductor material, such as silicon (Si), whereas the second semiconductor material for the stacks 11a, 11b that is present on the first semiconductor material may be composed of a silicon and germanium containing semiconductor material, such as silicon germanium (SiGe). It is noted that this is only one example of semiconductor materials that may be used for the stacks 11a, 11b of nanosheets 10a, 10b.

As will be discussed in greater detail below, the germanium (Ge) content in the sacrificial sheets 10b may be varied. For example, the germanium (Ge) content may be selected to provide a high germanium content (HGC) material layer having a germanium content greater than 35 wt. %, which in some embodiments, the germanium content of the high germanium content (HGC) material may be greater than 40 wt. %. In some instances, the germanium content of the high germanium content (HGC) material may range from 35 wt. % to 75 wt %. Higher germanium content (HGC) material for the composition of the sacrificial sheets 10b may be employed when the sacrificial sheets 10b provide the source for the work function adjustment element that is introduced to the surface of the nanosheet 10a that provides the channel region of the nanosheet semiconductor devices.

In other embodiments, the content of the germanium (Ge) in sacrificial sheets 10b may be selected to aid in epitaxial growth processing that does not create excessive strain and/or defect formation. For example, when the substrate 5 is composed of silicon (Si), and the channel providing sheets 10a of the stacks 11a, 11b are composed of silicon (Si), the first sacrificial sheet 10b separating the channel providing layer 10a of the stacks 11a, 11b from the substrate 5 may be composed of silicon germanium (SiGe) having a graded germanium (Ge) content. For example, a buffer layer portion of silicon germanium (SiGe) having a germanium (Ge) content of 20 wt. % or less may first be formed on the substrate 5 followed by a high germanium content (HGC) material portions having a germanium content greater than 40 wt. %, wherein the first of the channel providing layers 10a of the stacks 11a, 11b is formed on the high germanium content (HGC) material portions.

It is noted that in some embodiments, the sacrificial sheets 10b do not need to be composed of silicon germanium (SiGe), so long as the material employed for the sacrificial sheets 10b can be removed selectively to the channel providing layers 10a of the stacks 11a, 11b The stacks 11a, 11b of the at least two semiconductor materials may be formed using a deposition process, such as chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes suitable for use the present disclosure include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

The thickness of each of the at least two semiconductor material layers for the channel providing layers 10a and the sacrificial sheets 10b may range from 1 nm to 30 nm. In another embodiment, the thickness of each of the at least two semiconductor material layers may range from 5 nm to 20 nm.

Following deposition, the semiconductor material layers may be patterned to provide the geometry of the stacks 11a, 11b of the nanosheets 10a, 10b. In some embodiments, the semiconductor material layers may be patterned using deposition, photolithography and subtractive etch processing.

It is noted that although only two stacks 11a, 11b of nanosheets are depicted, the methods described herein are applicable to any number of stacks. For example, the number of stacks 11a, 11b may be equal to four stacks of nanosheets to provide 4 different types of semiconductor devices on a same substrate. For example, the number of stacks of nanosheets, similar to stacks 11a, 11b, may be processed to provide any combination of (1) NMOS with sacrificial silico germanium (SiGe), (2) NMOS without sacrificial SiGe, (3) PMOS with Sacrificial SiGe, (4) PMOS without Sacrificial SiGe. The sacrificial silicon germanium (SiGe) is one example of a sacrificial layer of work function adjusted material 15, in which germanium provides the work function adjusting material.

A shallow trench isolation region 6 may be formed between the stack of semiconductor material layers that provides the stack 11a of nanosheets 10a, 10b for the first device, and the stack of semiconductor material layers that provides the stack 11b of the nanosheets 10a, 10b for the second device, as depicted in FIG. 1A.

The process flow may continue with forming a replacement gate structures (not shown) on the channel portions of the stacks 11a, 11b of the at least two semiconductor materials. By "replacement" it is meant that the structure is present during processing of the semiconductor device, but is removed from the semiconductor device prior to the device being completed. In the present process flow, a replacement gate structure 15 is employed as part of a replacement gate process. As used herein, the term "replacement gate structure" denotes a sacrificial structure that dictates the geometry and location of the later formed functioning gate structure. The "functional gate structure" operates to switch the semiconductor device from an "on" to "off" state, and vice versa.

In one embodiment, the sacrificial material that provides the replacement gate structure may be composed of any material that can be etched selectively to the at least one of the material layers of the stacks of the at least two semiconductor materials. In one embodiment, the replacement gate structure may be composed of a silicon-including material, such as polysilicon. In another embodiment, the replacement gate structure may be composed of a dielectric material, such as an oxide, nitride or oxynitride material, or amorphous carbon. The replacement gate structure may be formed using deposition (e.g., chemical vapor deposition) photolithography and etch processes (e.g., reactive ion etching).

Referring to FIGS. 1A and 1B, a spacer 12 is formed on the sidewall of each of the replacement gate structures for the first nanosheet devices and the second nanosheet devices. The spacer 12 is typically composed of a dielectric material, such as an oxide, nitride, or oxynitride material. The spacer 12 may be formed using a deposition process, such as chemical vapor deposition (CVD), and an anisotropic etch back method.

Following the formation of the replacement gate structure, the exposed portions of the stack of two semiconductor materials that extend beyond the replacement gate structures for each of the stack of nanosheets 11a for the first nanosheet device and the stack of nanosheets 11b for the second nanosheet device. In some embodiments, the etch process for removing the exposed portions of the stacks of the at least two semiconductor materials is an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

Referring to FIG. 1B, in one embodiment, the method continues with forming the source and drain regions 13a, 13b for the first conductivity type nanosheet devices and the second conductivity type nanosheet devices. The term "conductivity type" denotes whether a device has source and drain regions doped to an n-type or a p-type conductivity type. As used herein, "p-type" refers to the addition of impurities to an intrinsic semiconductor that creates deficiencies of valence electrons. For example, in a type IV semiconductor material, such as silicon (Si), germanium (Ge) or silicon germanium (SiGe), examples of p-type dopants, i.e., impurities, include but are not limited to: boron, aluminum, gallium and indium. As used herein, "n-type" refers to the addition of impurities that contributes free electrons to an intrinsic semiconductor. For example, in a type IV semiconductor, such as a silicon (Si), germanium (Ge), and silicon germanium (SiGe), examples of n-type dopants, i.e., impurities, include but are not limited to antimony, arsenic and phosphorous.

In one example, the first stack 11a of nanosheets 10a, 10b may be processed to provide first conductivity type devices; and the second stack 11b of nanosheets 10a, 10b may be processed to provide second conductivity type devices. In some embodiments, the first conductivity type may be n-type, while the second conductivity type may be p-type. In some embodiments, the first conductivity type may be p-type, while the second conductivity type may be n-type. In another example, the first and second stacks 11a, 11b of nanosheets may be processed to provide two the same conductivity type devices, i.e., both stacks 11a, 11b provide n-type or p-type devices. As noted above, the use of the sacrificial layer of work function adjusted material 15 may be implemented to provides 4 different types of semiconductor devices on a same substrate. For example, the first and second stacks 11a, 11b may be processed to provide any combination of (1) NMOS with Sacrificial SiGe, (2) NMOS without Sacrificial SiGe, (3) PMOS with Sacrificial SiGe, (4) PMOS without Sacrificial SiGe.

The source and drain regions 13a, 13b may be composed of epitaxial semiconductor material. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

The epitaxial semiconductor material grows from the etched sidewall surface of the semiconductor material layers that provide the stacks 11a, 11b of nanosheets 10a, 10b. In some embodiments, the epitaxial semiconductor material may be composed of silicon (Si), germanium (Ge), silicon germanium (SiGe), silicon doped with carbon (Si:C) or the epitaxial semiconductor material may be composed of a type III-V compound semiconductor, such as gallium arsenide (GaAs). In one embodiment, a number of different sources may be used for the epitaxial deposition of the epitaxial semiconductor material. Examples of silicon including source gasses may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming an undoped epitaxial semiconductor material of a germanium containing semiconductor include germane, digermane, halogermane, dichlorogermane, trichlorogermane, tetrachlorogermane and combinations thereof.

Epitaxial deposition may be carried out in a chemical vapor deposition apparatus, such as a metal organic chemical vapor deposition (MOCVD) apparatus or a plasma enhanced chemical vapor deposition (PECVD) apparatus. The epitaxial semiconductor material may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In the embodiments in which the semiconductor device being formed has p-type source and drain regions, and is referred to as a p-type semiconductor device, the doped epitaxial semiconductor material is doped with a p-type dopant to have a p-type conductivity. In a type IV semiconductor, such as silicon, examples of p-type dopants, i.e., impurities, include but are not limited to, boron, aluminum, gallium and indium. In a type IV semiconductor, such as silicon, examples of n-type dopants, i.e., impurities, include but are not limited to antimony, arsenic and phosphorous.

In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$). The p-type gas dopant source may include diborane ($B_2H_6$).

In some embodiments, the source and drain regions 13a to the first stack 11a of nanosheets 10a may be doped to a p-type conductivity to provide p-type nanosheet semiconductor devices; and the source and drain regions 13b to the second stack 11b of nanosheets 10a may be doped to an n-type conductivity to provide n-type nanosheet semiconductor devices. In some embodiments, the source and drain regions to the first stack 11a of nanosheets 10a may be doped to an n-type conductivity to provide n-type nanosheet semiconductor devices; and the source and drain regions 13b to the second stack 11b of nanosheets 10a may be doped to a p-type conductivity to provide p-type nanosheet semiconductor devices. It is noted that the above description of the conductivity types for the source and drain regions 13a, 13b are provided for illustrative purposes only, and are not intended to limit the present disclosure. As noted above, the use of the sacrificial layer of work function adjusted material 15 may be implemented to provides 4 different types of semiconductor devices on a same substrate 5. For example, the first and second stacks 11a, 11b may be processed to provide any combination of (1) NMOS with Sacrificial SiGe, (2) NMOS without Sacrificial SiGe, (3) PMOS with Sacrificial SiGe, (4) PMOS without Sacrificial SiGe.

The method may continue with removing the replacement gate structures to provide the structure depicted in FIGS. 1A and 1B. In some embodiments, removing the replacement gate structure may begin with forming an interlevel dielectric layer on the portions of the device including the source and drain regions, and planarizing the interlevel dielectric layer to expose an upper surface of the replacement gate structures to each stack of semiconductor material layers that provides the stack of nanostructures 11a for the first device, and the stack of nanostructures 11b for the second device. The replacement gate structure may be removed using a wet or dry etch process. In one embodiment, the first replacement gate structure may be removed by at least one of an anisotropic etch process, such as reactive ion etch (RIE), or an isotropic etch process, such as a wet chemical etch. In one example, the etch process for removing the first replacement gate structure can include an etch chemistry for removing the first replacement gate structure is selective to the material layers of the first and second stacks 11a, 11b of nanosheets 10a, 10b.

Figure 2:
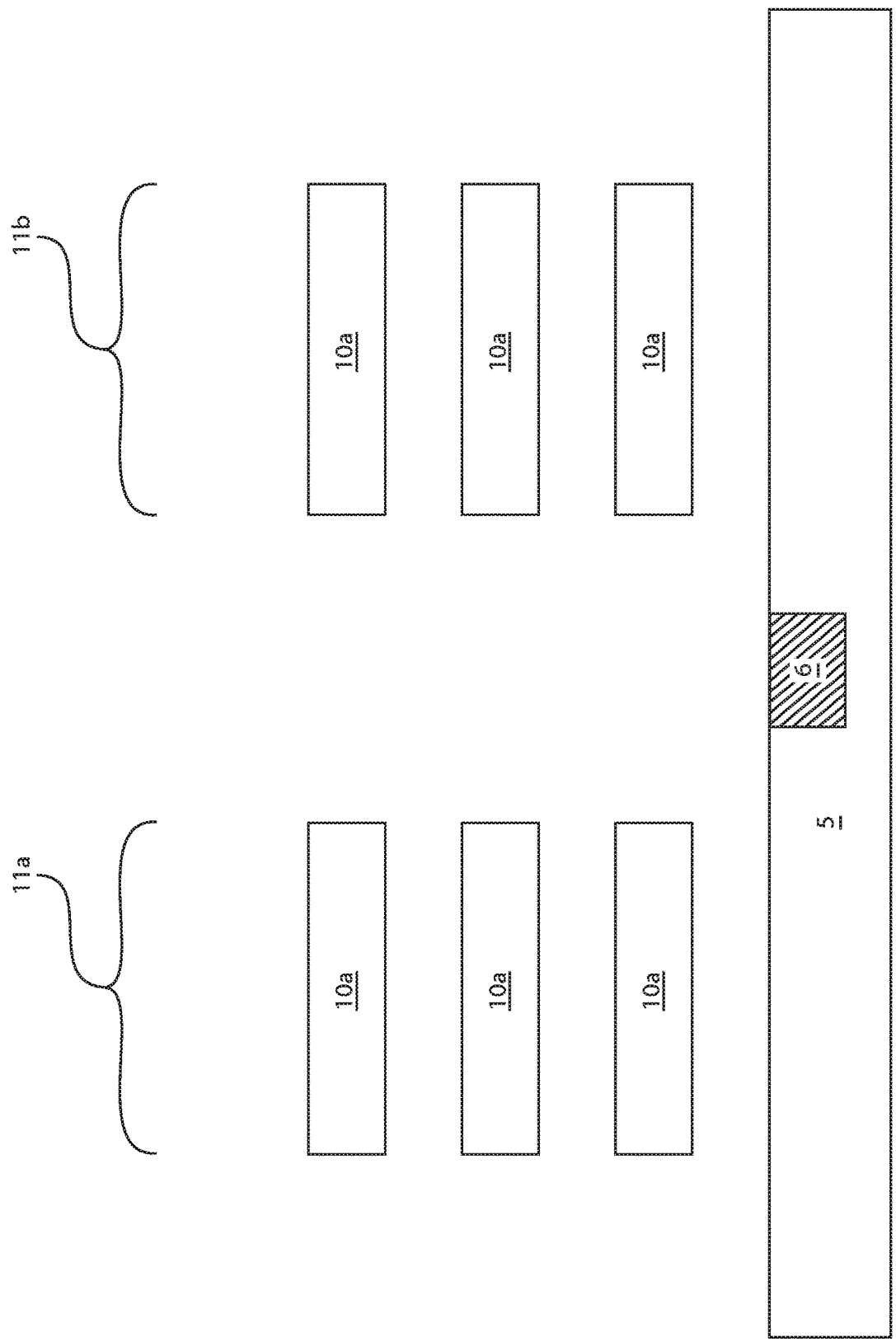
FIG. 2 is a side cross-sectional view depicting removing one material of the stack of nanosheets selectively to at least one remaining material of the two stacks of nanosheets, the remaining material providing the channel region for the semiconductor device corresponding to each stack of nanosheets.

FIG. 2 depicts removing one material layer, i.e., the sacrificial nanosheets 10b, of the stack of nanosheets selectively to at least one remaining material, i.e., channel providing nanosheets 10a, of the two stacks of nanosheets 11a, 11b, the remaining material providing the channel region for the semiconductor devices corresponding to each stack 11a, 11b of nanosheets 10a. For example, in one embodiment when the channel providing nanosheets 10a of the stacks 11a, 11b is composed of silicon (Si), and the sacrificial nanosheets 10b of the stacks 11a, 11b is composed of silicon germanium (SiGe), the sacrificial nanosheets 10b may be removed selectively to the channel providing nanosheets 10a with an etch process, such as a wet chemical etch. Removing the replacement gate structure produces a gate opening that exposes a channel portion of the stacks of the two semiconductor materials that are processed to provide the first stack 11a of the nanosheets 10a for the first nanosheet devices and the second stack 11b of the nanosheets 10a for the second nanosheets devices.

Following removal of one of the material layers of the stack, e.g., removal of the sacrificial nanosheets 10b of the stack, a suspended channel structure is provided, as depicted in FIG. 2. By "suspended channel" it is meant that at least one semiconductor material layer, i.e., channel providing nanosheets 10a, is present overlying the substrate 5, wherein the sidewalls of the suspended channel are supported, e.g., anchored, in the spacer 12. Gate structure materials, electrically conductive materials and/or semiconductor materials may be formed in the space surrounding the suspended structures. The term "nanosheet" denotes a substantially two dimensional structure with thickness in a scale ranging from 1 to 100 nm. The width and length dimensions of the nanosheet may be greater than the width dimensions. Although FIG. 2 depicts three suspended channel structures for each of the first stack 11a of nanosheets 10a and the second stack 11b of nanosheets 10a, the present disclosure is not limited to only this embodiment. Any number of suspended channel structures, as suspended nanosheets 10a, may be formed using the methods and structures provided by the present disclosure.

Figure 3:
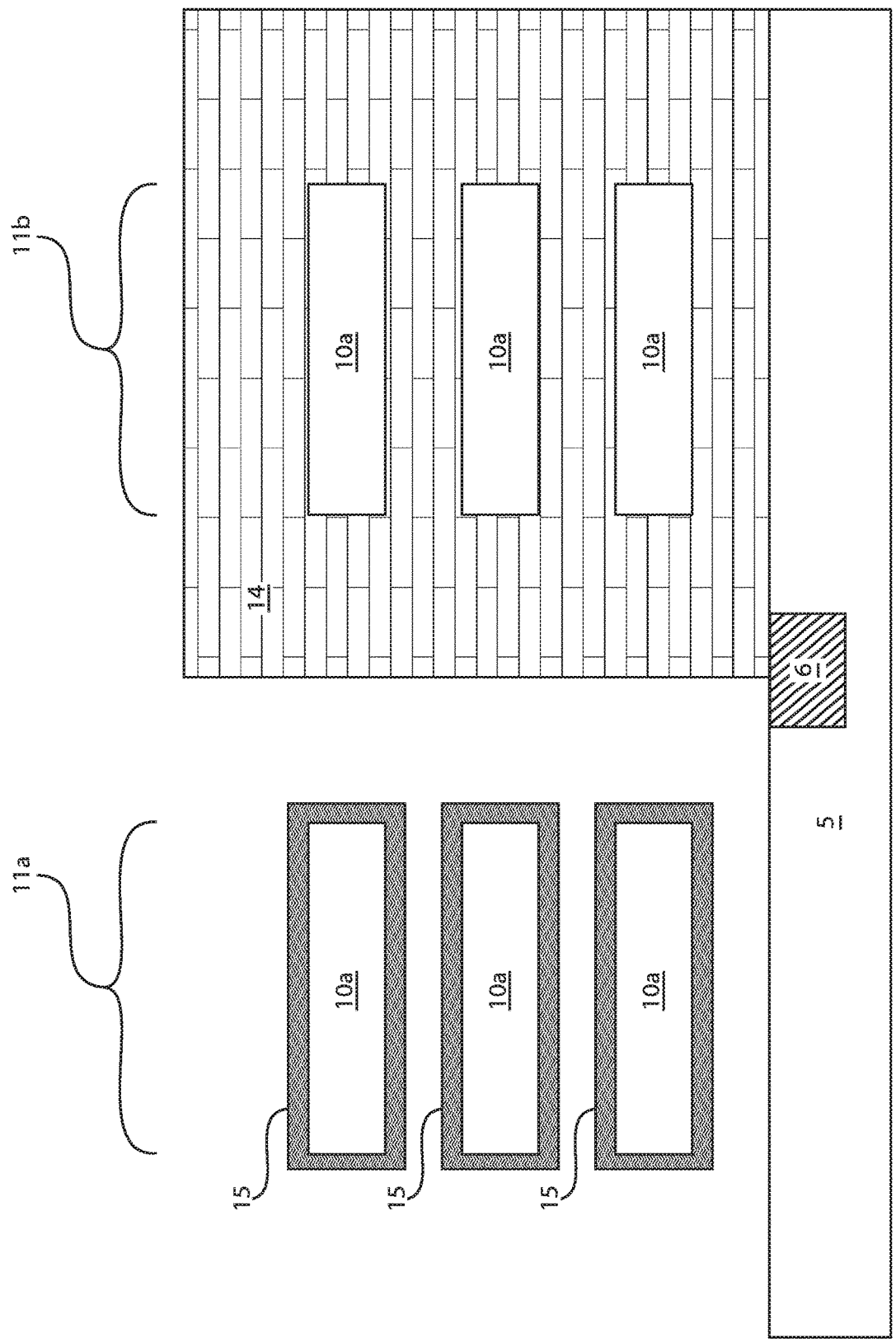
FIG. 3 is a side-cross sectional view depicting one embodiment of forming a sacrificial layer of a work function adjusting material on the semiconductor material of the a first stack of nanosheets, in which the sacrificial layer of the work function adjusting material is not formed on the second stack of nanosheets, in accordance with one embodiment of the present disclosure.

FIG. 3 depicts one embodiment of forming a sacrificial layer of a work function adjusting material 15 on the semiconductor material, i.e., channel providing sheets 10a, of the first stack of nanosheets 11a, in which the sacrificial layer of the work function adjusting material 15 is not formed on the second stack of nanosheets 11b. To provide that the sacrificial layer of the work function adjusting material 15 is not formed on the channel providing nano sheets 10a of the second stack 11b, a block mask 14 can be formed overlying the second stack 11b prior to depositing the sacrificial layer of the work function adjusting material 15. The block mask 14 that is present over the second stack 11b of nanosheets 10a leaves the first stack 11a of nanosheets 10a exposed.

In some embodiments, the block mask 14 may comprise soft and/or hardmask materials and can be formed using deposition, photolithography and etching. In one embodiment, the block mask 14 may be composed of a photoresist material. In one embodiment, the block mask 14 is a hardmask composed of a nitride-containing material, such as silicon nitride. It is noted that it is not intended that the block mask 14 be limited to only silicon nitride, as the composition of the hardmask may include any dielectric material that may be deposited by chemical vapor deposition (CVD) and related methods. Other hardmask compositions for the block mask 14 may include silicon oxides, silicon oxynitrides, silicon carbides, silicon carbonitrides, etc. Spin-on dielectrics may also be utilized as a hardmask material including, but not limited to: silsequioxanes, siloxanes, and boron phosphate silicate glass (BPSG).

Still referring to FIG. 3, while the block mask 14 is present overlying the second stack 11b of nanosheets 10a, the sacrificial layer of a work function adjusting material 15 is epitaxially formed on the semiconductor material, i.e., channel providing nanosheets 10a, of the first stack of nanosheets 11a. In some embodiments, the sacrificial layer of work function adjusting material 15 may be composed of high germanium concentration (HGC) silicon germanium (SiGe). As used herein, the term high germanium concentration (HGC) denotes a silicon and germanium (SiGe) containing material layer, in which the germanium (Ge) content is greater than 35 wt. %. For example, the germanium (Ge) content of the high germanium concentration (HGC) material can be greater than 40 wt. %. In some examples, the germanium (Ge) content of the high germanium concentration (HGC) material can range from 35 wt. % to 75 wt. %. In some other examples, the germanium (Ge) content of the high germanium concentration (HGC) material can range from 40 wt. % to 71 wt. %. It is noted that the above germanium (Ge) wt. % are provided for illustrative purposes only, and are not intended to limit the present disclosure. In other examples, the germanium (Ge) content of high germanium content (HGC) material silicon germanium (SiGe) may be equal to 35 wt. %, 40 wt. %, 45 wt. %, 50 wt. %, 55 wt. %, 60 wt. %, 65 wt. %, 70 wt. % and 75 wt. %, as well as any range of values including one of the aforementioned examples as a lower limit of the range and one of the aforementioned examples as an upper limit of the range.

The sacrificial layer of work function adjusting material 15 may be epitaxially formed on the exposed channel surfaces of the channel providing nanosheets 10a of the first stack 11a of the nanosheets, while the second stack 11b is covered by the block mask 14. The epitaxial growth process selectively forms the work function adjusting material 15 on the exposed semiconductor surfaces, which are provided by the channel providing nanosheets 10 of the first stack 11a. The work function adjusting material 15 is not formed on the channel providing nanosheets 10a of the second stack 11a, because it is covered with the block mask 14.

The sacrificial layer of work function adjusting material 15 may be deposited using an epitaxial deposition process. The epitaxial deposition process for forming the work function adjusting material 15 is similar to the epitaxial deposition process that has been described above for forming the source and drain regions 13a, 13b. Therefore, the epitaxial deposition process that has been described for forming the source and drain regions 13a, 13b is suitable for providing one example of the deposition process for forming the sacrificial layer of the work function adjusting material 15. For example, the work function adjusting material 15 may be composed of silicon germanium that is epitaxially deposited using silicon and germanium containing source gasses. Examples of silicon including source gasses may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming an undoped epitaxial semiconductor material of a germanium containing semiconductor include germane, digermane, halogermane, dichlorogermane, trichlorogermane, tetrachlorogermane and combinations thereof. To provide higher germanium concentration (HCG) silicon germanium (SiGe) the germanium source gasses may be increased. The sacrificial layer of the work function adjusting material 15 may be an intrinsic semiconductor that is free of n-type and/or p-type dopant.

The amount of material for the sacrificial layer of the work function adjusting material 15 is selected to provide an appropriate amount of elements from the work function adjusting material 15 to effectuate a threshold voltage shift; yet the volume of material deposit does not prohibit its removal, e.g., removal between adjacently stacked nanosheets 10a. For example, the sacrificial layer of work function adjusting material 15 depicted in FIG. 3 is present on the upper and lower surfaces of the channel providing sheets 10a of the first stack 11a without filling the space between adjacently stacked nanosheets 10a.

Figure 4:
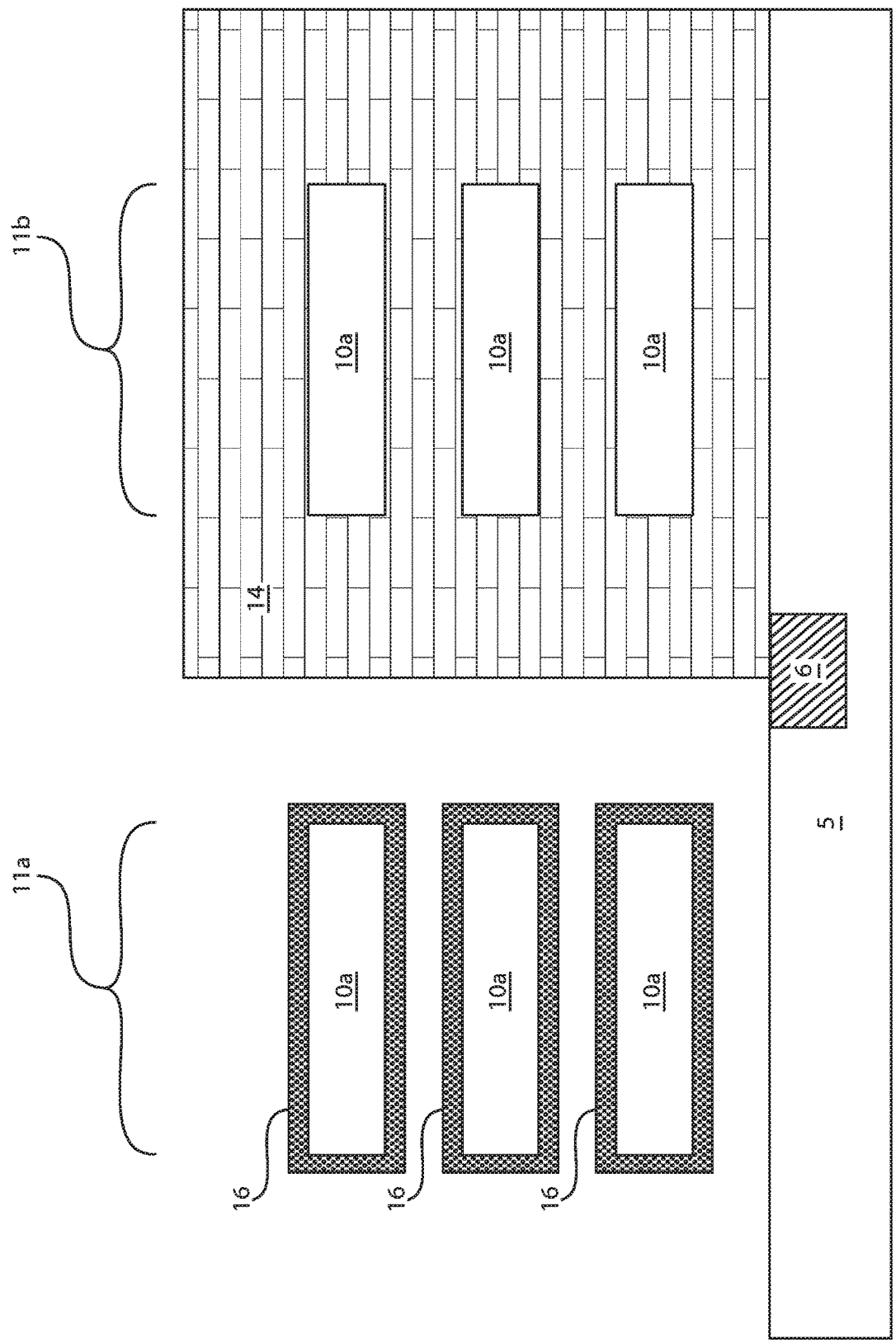
FIG. 4 is a side cross-sectional view depicting intermixing the work function adjusting material into the semiconductor material on at least a channel surface of nanosheets in said stack of nanosheets, and removing the sacrificial layer of a work function adjusting material, in accordance with one embodiment of the present disclosure.

FIG. 4 depicts intermixing the work function adjusting material, e.g., germanium (Ge), into the semiconductor material, e.g., silicon (Si), of the channel surface of nanosheets 10a in the stack of nanosheets 11a, and removing the sacrificial layer of a work function adjusting material 15. In some embodiments, epitaxially forming the sacrificial layer of the work function adjusting material 15 onto the channel providing nanosheets 10a causes the elements of the work function adjusting material, e.g., germanium (Ge), to intermix with the semiconductor material, e.g., silicon (Si), of the nanosheets 10a. The intermixed portion of the semiconductor material beginning at the surface of the channel providing nanosheets 10a with the work function adjusting elements from the sacrificial layer of the work function adjusting material 15 may have a thickness ranging from 0.5 nm to 3 nm. The intermixed portion of the semiconductor material of the channel providing nanosheets 10a and the work function adjusting elements from the sacrificial layer of the work function adjusting material 15 may be referred to as a reacted layer 16.

In some embodiments, intermixing of the work function adjusting elements, e.g., germanium (Ge), with the semiconductor material, e.g., silicon (Si), of the channel providing nanosheets 10, may be accelerated by elevated temperatures via annealing. In this example, the intermixing of the work function adjusting elements, e.g., germanium (Ge), with For example, rapid thermal annealing (RTA), infrared annealing, laser annealing, furnace annealing or a combination thereof may be employed to increase the temperature to accelerate intermixing of the work function adjusting elements with the channel portion of the nanosheets. For example, the temperature of the annealing process may range from 700° C. to 1050° C.

Following the formation of the reacted layer 16, the non-reacted portion of the sacrificial layer of the work function adjusting elements 15 is removed. The sacrificial layer of the work function adjusting elements 15 may be remove using an etch process. In some embodiments, the sacrificial layer of the work function adjusting elements 15 may be removed by a selective etch process that removes the material of the sacrificial layer of the work function adjusting elements selectively to the reacted layer 16. The selective etch process may also be selective to the block mask 14. The selective etch process may be provided by a wet chemical etch. The selective etch process may also be provided by dry etch processes, such as a plasma etch.

Figure 5:
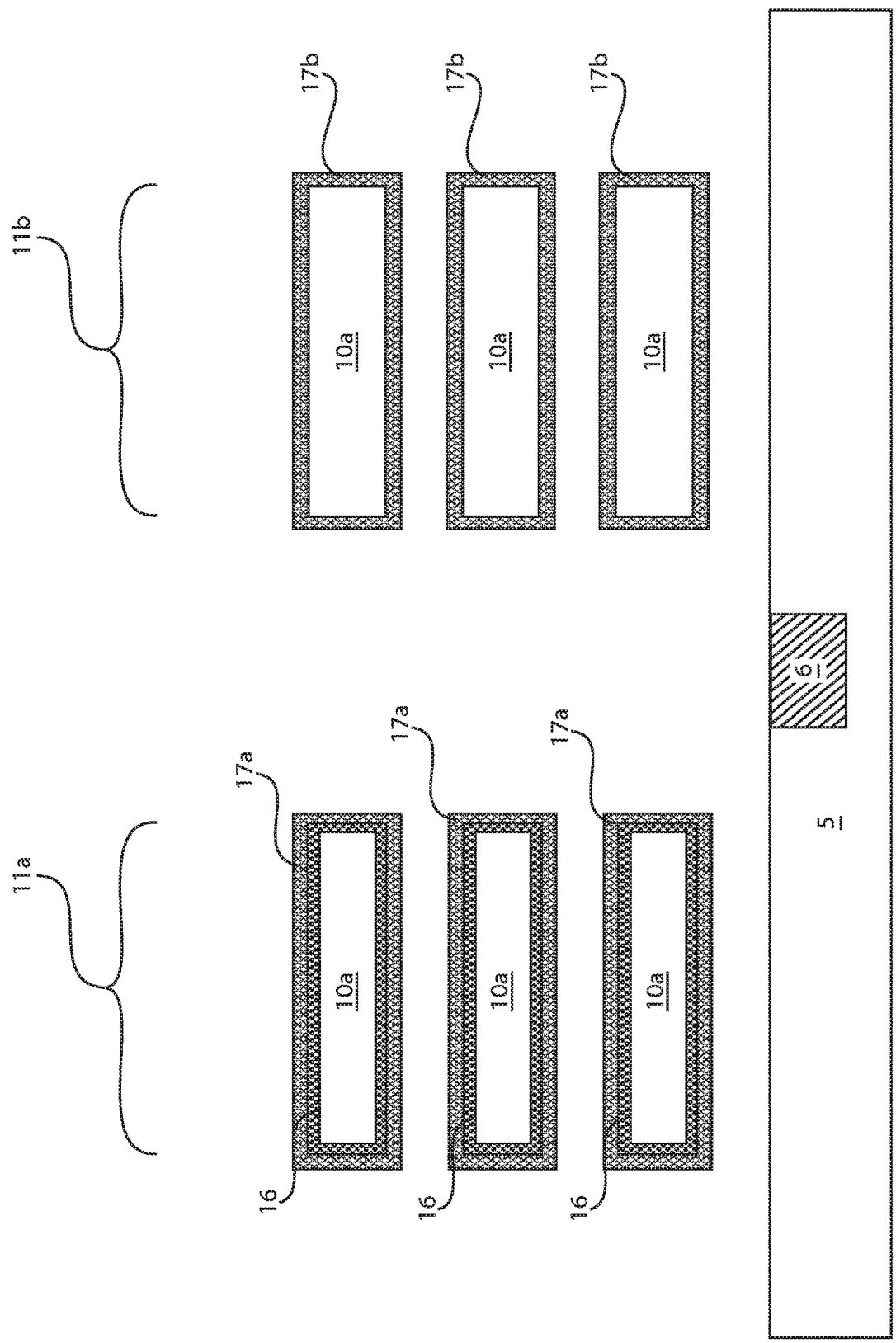
FIG. 5 is a side cross-sectional view depicting forming an interfacial oxide including elements from the semiconductor material and the work function adjusting layer on said at least the channel surface of the nanosheets in the first stack of nanosheets, in accordance with one embodiment of the present disclosure.

FIG. 5 depicts forming an interfacial oxide layer 17a including elements from the semiconductor material and the work function adjusting layer on said at least the channel surface of the nanosheets 10a in the first stack of nanosheets 11a. In some embodiments, the block mask 14 is removed prior to forming the interfacial oxide layer 17a on the reacted surface layer 16 of the channel providing layer 10 of the first stack 11a. In this manner, an interfacial oxide layer 17a is provided on the reacted surface layer 16 of the channel providing nanosheets 10a in the first stack of nanosheets 11a, as well as an interfacial oxide layer 17b formed directly on the semiconductor surface of the channel providing nanosheets 10a of the second stack of nanosheets 10a that do not include the reacted surface layer 16. The block mask 14 may be removed by selective etching and/or oxygen ashing.

The interfacial oxide layer 17, 17b may be formed by introducing the reacted surface layer 16 of the channel providing nanosheets 10a, as well as the semiconductor surface of the nanosheets 10a that do not include the reacted surface layer 16, with an oxygen containing atmosphere. The oxygen containing atmosphere may be an oxygen containing gas ($O_2$), a mist of oxygen containing liquid ($H_2O$), and/or an oxygen containing liquid. In one embodiment, the oxidizing treatment comprises wet treatment including H2O:H2O2:NH4OH, which can be referred to as an SC1 composition. The thickness of the interfacial oxide layer 17a, 17b may range from 0.5 nm to 3 nm. In one embodiment, the thickness of the interfacial oxide layer 17a, 17b may range from 0.5 nm to 1.5 nm.

The composition of the interfacial oxide layer 17a, 17b is silicon oxide ($SiO_2$) based. For example, the interfacial oxide 17b on the channel providing nanosheets 10a of the second stack 11b may be 100% silicon oxide ($SiO_2$). The composition of the interfacial oxide layer 17a that is present on the channel providing nanosheets 10a that include the reacted surface layer 16 in the first stack 11a include the work function adjusting elements that were introduced to the reacted surface layer 16 from the sacrificial layer of the work function adjusting elements 15. In some embodiments, the interfacial oxide layer 17a comprises silicon (Si), oxygen (O) and germanium (Ge), in which the germanium is the work function adjusting elements. In some examples, the interfacial oxide layer 17a may be composed of a mix of germanium oxide ($GeO_2$) and silicon oxide and germanium oxide ($SiO_2+GeO_2$), in which the $GeO_2/(SiO_2+GeO_2)$ has an atomic % ranging from 25% to 75%. In one example, when the channel providing nanosheet 10a is silicon (Si), and the interfacial oxide layer 17a comprises silicon oxide ($SiO_2$) intermixed with germanium (Ge), the work function adjusting elements in gate stack including a hafnium containing gate dielectric provides up to a 200 mV threshold voltage shift, i.e., when compared to a gate structure that does not include the work function adjusting elements, but is otherwise substantially identical.

Figure 6:
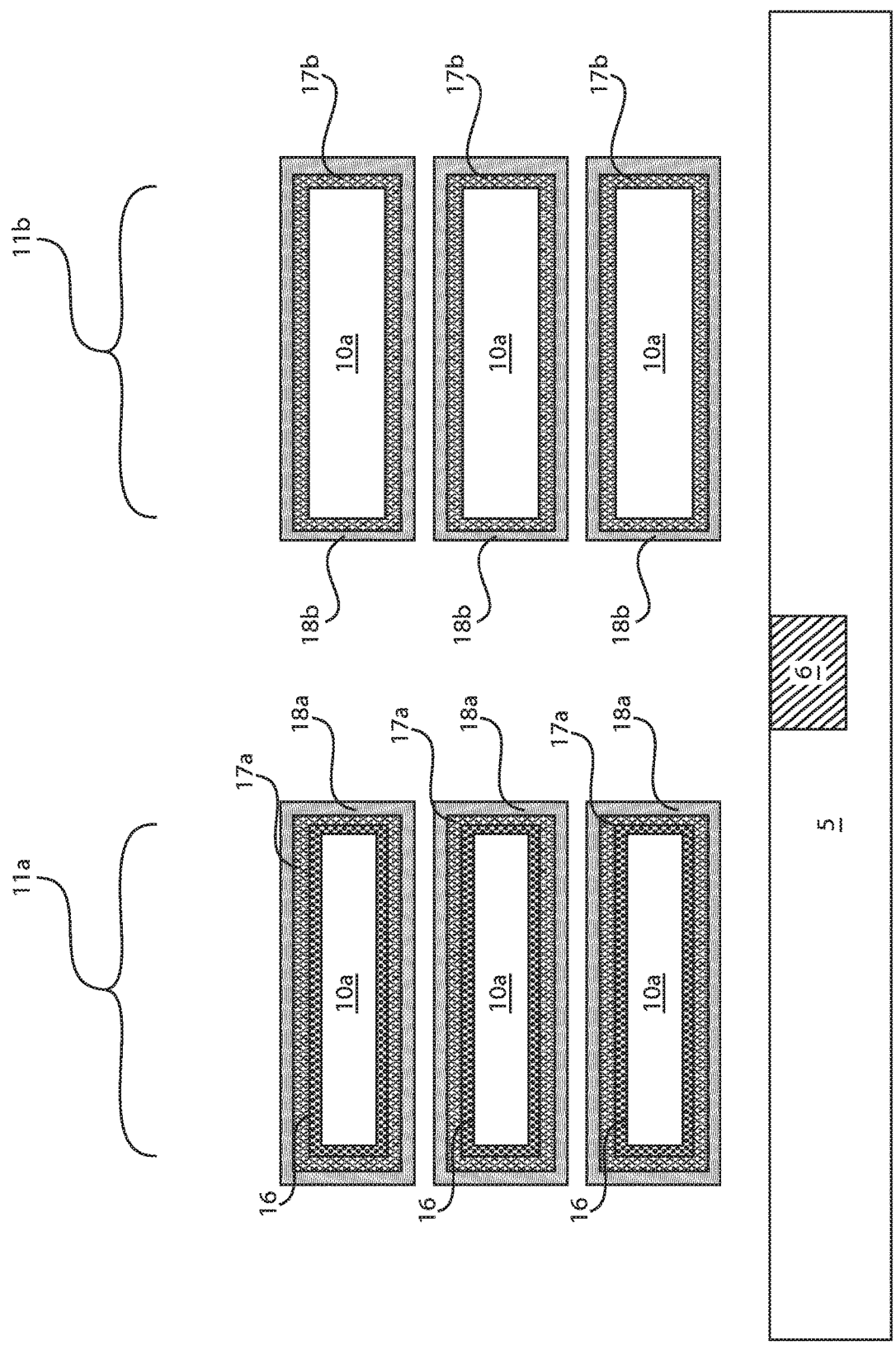
FIG. 6 is a side cross-sectional view depicting one embodiment of forming a gate dielectric on the channel regions of the nanosheets in the first and second stacks of nanosheets, wherein the gate dielectric on the first stack of nanosheets includes an interfacial oxide including elements from the work function adjusting layer.
Figure 7:
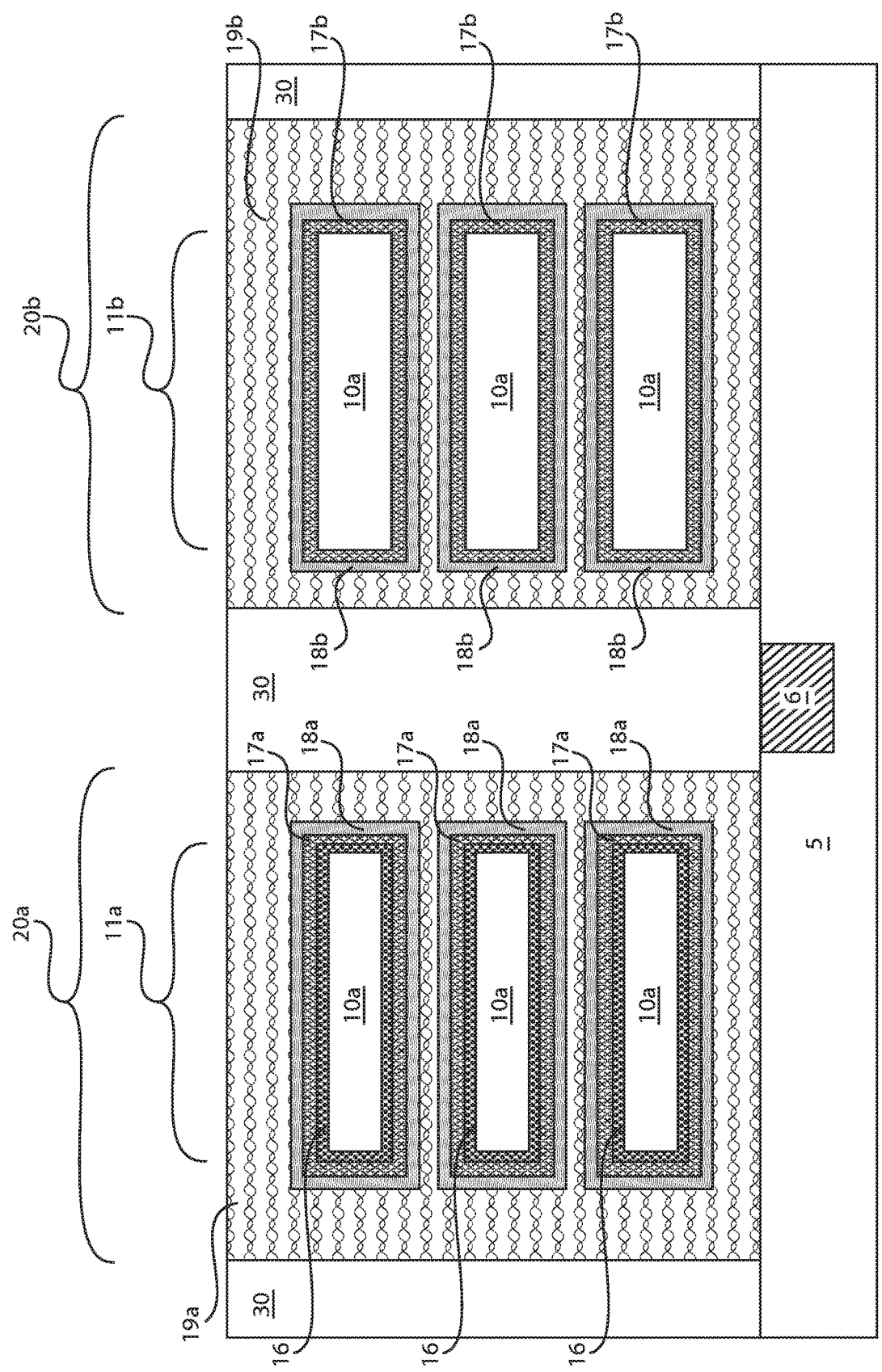
FIG. 7 is a side cross-sectional vie depicting one embodiment of forming a gate electrode on the gate dielectrics in the first and second stacks of nanosheets.

FIGS. 6 and 7 depict one embodiment of forming a gate structure 20a, 20b on the channel regions of the nanosheets 10a in the first and second stacks of nanosheets 11a, 11b, wherein the gate structure 20a to the first stack of nanosheets includes a gate dielectric 18a on the interfacial oxide layer 17a including elements from the work function adjusting layer.

Referring to FIG. 6, the method may continue with depositing a gate dielectric 18a, 18b on the channel regions of the nanosheets 10a in the first and second stacks 11a, 11b. The gate dielectric 18a, 18b is a portion of the functional gate structure. The functional gate structure operates to switch the semiconductor device from an "on" to "off" state, and vice versa. The gate dielectric 18a, 18b can be formed on the entirety of the exterior surface of the nanosheets 10a. The gate dielectric layer 18a that is formed on the channel providing layer 10a of the first stack 11a is formed directly on the interfacial oxide layer 17a including the work function adjusting elements, e.g., germanium (Ge). The gate dielectric layer 18b that is formed on the channel providing layer 10a of the second stack 11b is formed directly on the interfacial oxide layer 17b that does not include the work function adjusting elements.

The at least one gate dielectric 18a, 18b may comprise a semiconductor oxide, semiconductor nitride, semiconductor oxynitride, or a high k material having a dielectric constant greater than silicon oxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In one preferred embodiment, the at least one gate dielectric 18a, 18b is composed of high-k hafnium containing material, such as hafnium oxide. The term "high-k" denotes a dielectric material having a dielectric constant that is greater than the dielectric constant of silicon oxide. For example, a high-k dielectric material may have a dielectric constant that is greater than 4.0 at room temperature and atmospheric pressure.

The gate dielectric 18a, 18b may be deposited on the channel region portions of the first and second stacks 11a, 11b of nanosheets 10a using atomic layer deposition (ALD). Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. In some embodiments, the atomic layer deposition (ALD) process may be a thin film deposition method in which a film is grown on a deposition surface by exposing the surface to alternate gaseous species (typically referred to as precursors). In contrast to chemical vapor deposition, the precursors are never present simultaneously in the reactor, but they are inserted as a series of sequential, non-overlapping pulses. In each of these pulses, the precursor molecules react with the surface in a self-limiting way, so that the reaction terminates once all the reactive sites on the surface are consumed. In some embodiments, the monolayer deposition provided by the atomic layer depositions mechanisms provides that the layer be conformal.

The at least one gate dielectric 18a, 18b can also be formed by chemical vapor deposition (CVD), such as plasma enhanced chemical vapor deposition (PECVD), metal organic chemical vapor deposition (MOCVD), or atomic layer deposition (ALD). In another embodiment, the at least one gate dielectric can be formed using thermal growth methods, such as oxidation. In some embodiments, the at least one gate dielectric 18a, 18b may have a thickness ranging from about 1.0 nm to about 6.0 nm.

Referring to FIG. 7, following the formation of the gate dielectric layer 18a, 18b, a gate electrode 19, 19b for the functional gate structure may be formed. The method may continue with depositing a gate electrode material layer, and patterning the stack of the gate electrode material to provide a gate electrode 19a to the first stack 11a, and a second gate electrode 19b to the second stack 11b. The at least one gate electrode material may comprise a doped semiconductor, such as n-type polysilicon, or an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. In some other embodiments, the at least one gate electrode 19a, 19b may be composed of an electrically conductive semiconductor, such as doped silicon (Si), e.g., n-type doped polysilicon. The at least one gate electrode material layer can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes.

Following deposition of the gate electrode material layer, chemical mechanical polish (CMP) is performed to provide a first gate structure 20a composed of a first portion of the gate electrode material layer, i.e., first gate electrode 19a, and a second gate structure 20b composed of a second portion of the gate electrode material layer, i.e., second gate electrode 19b in the trenches formed into an interlevel dielectric 30. The interlevel dielectric 30 is not depicted in the prior Figures for the purposes of clarity, but is present as part of the replacement gate process. More specifically, the interlevel dielectric 30 is present at the time that the sacrificial gate structures are removed to expose the channel portions of the nanosheets 10.

It is noted that the process sequence that is provided with reference to FIGS. 1-7 is only one embodiment of the present disclosure. In another embodiment, the method may form a reacted layer 16 including work function adjusting elements, e.g., germanium (Ge), on the channel surface of channel providing nanosheets 10a for both the stacks of nanosheets 11a, 11b. In this embodiment, the reacted layer 16 can be removed from the stack of nanosheets 11b, in which a work function adjustment is not desired. Further details of this embodiment are now described with reference to FIGS. 1, 8 and 9.

In some embodiments, the method for producing nanosheet semiconductor devices includes providing a first stack 11a of nanosheets having a silicon containing surface on a first region of a substrate 5, and a second stack 11b of nanosheets 10a in a second region of the substrate 5; and forming a sacrificial layer of a work function adjusting material 10b on a channel region of the first and second stacks of nanosheets 11a, 11b. This step of the process flow is depicted in FIG. 1. In this embodiment, the original stacks 11a, 11b of nanosheets 10a, 10b that are processed to provide the suspended channels may include a sacrificial nanosheet that provides the work function adjusting element to the nanosheets that provide the channel regions of the devices. In this embodiment, the structure identified by reference number 10a in FIG. 1 provides the channel providing nanosheets, while the structure identified by reference number 10b provides the sacrificial layer of a work function adjusting material on a channel region of the first and second stacks of nanosheets 11a, 11b. Similar to the embodiments described with reference to FIGS. 1-7, in the embodiment that is described with reference to FIGS. 1, 8 and 9, the work function adjusting material may be germanium (Ge). The composition of the sacrificial layer of a work function adjusting material 10b may be high germanium concentration (HGC) silicon germanium (SiGe). For example, the germanium concentration may be greater than 35% in high germanium concentration (HGC) silicon germanium (SiGe). Further details on the use of high germanium concentration (HGC) silicon germanium (SiGe) as a sacrificial layer for introducing work function adjusting elements has been provided above in the descriptions of FIGS. 1 and 3. The description of forming the first and second stacks 11a, 11b provide for FIG. 1 is suitable for the process flow described with reference to FIGS. 1, 8 and 9.

Figure 8:
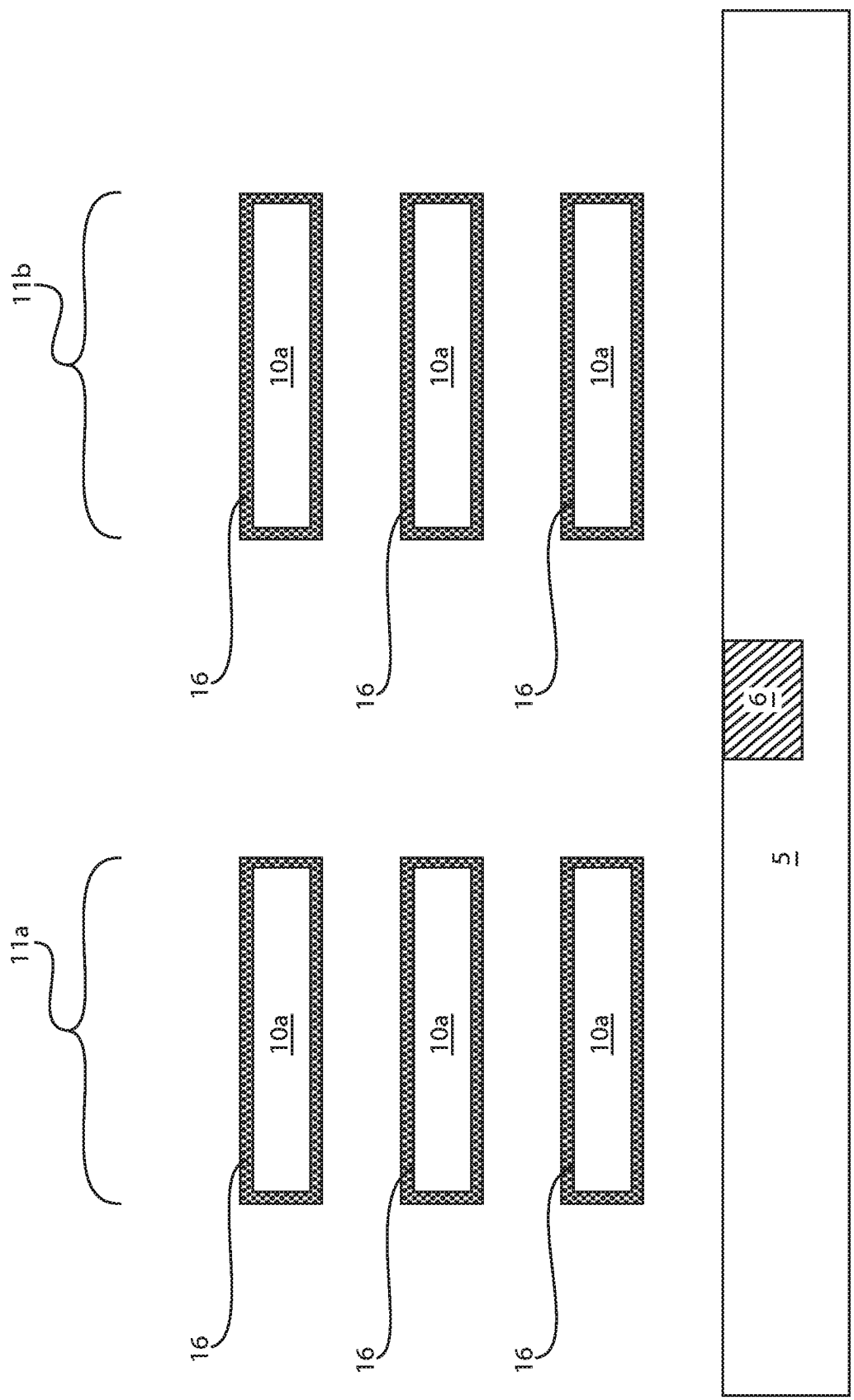
FIG. 8 is a side cross-sectional view of a process step from the process flow of another embodiment of the present disclosure, in which a sacrificial layer of a work function adjusting material is formed on the channel regions of both of a first and second stack of nanosheets, wherein the work function adjusting material is intermixed into the semiconductor material of at least a channel surface of nanosheets in said first and second stacks of nanosheets to provide a first and second reacted layer each comprising work function adjusting material.

FIG. 8 depicts one embodiment of where the work function adjusting material is intermixed into the semiconductor material of at least a channel surface of nanosheets in said first and second stacks of nanosheets to provide a first and second reacted layer 16 each comprising work function adjusting material. The intermixing of the work function adjusting elements, e.g., the geranium Ge) from the sacrificial nanosheet identified by reference number 10b, into the semiconductor material, e.g., silicon (Si), of the channel providing nanosheets 10a of the first and second stack 11a, 11b is similar to the description of the intermixing step to provide the reacted layer 16 that is described in FIG. 4. For example, in some embodiments, the intermixing of the work function adjusting material into the semiconductor material on at least the channel surface of said nanosheets 10a, 10b in said stack of nanosheets 11a, 11b can include thermal annealing. In the embodiment depcited in FIG. 8, the reacted layer is formed on the channel providing nanosheets 10a of the first and second stacks.

Figure 9:
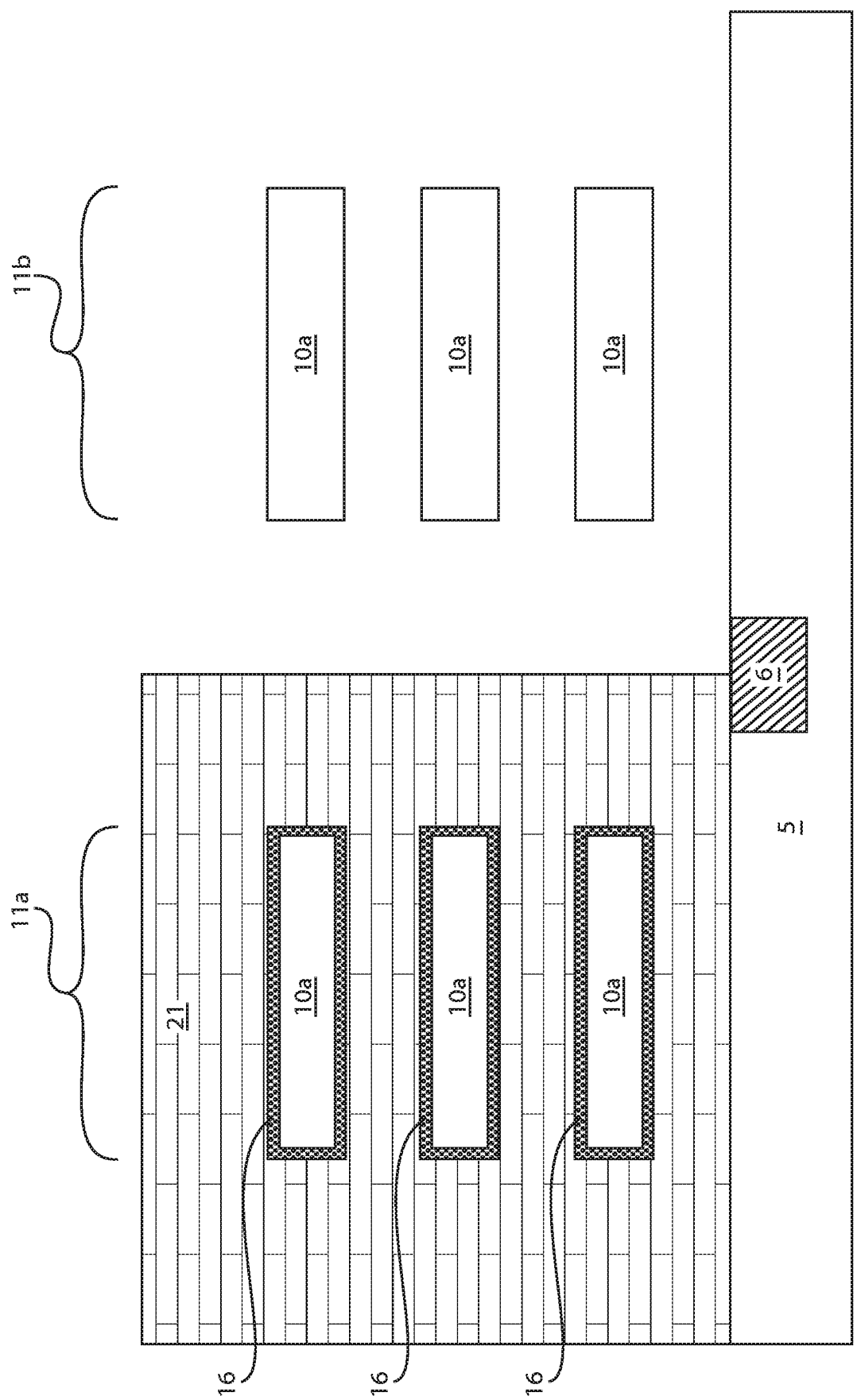
FIG. 9 is a side cross-sectional view depicting removing the second reacted layer from the second stacks of nanosheets that are depicted in FIG. 8, in accordance with one embodiment of the present disclosure.

FIG. 9 depicts removing the second reacted layer 16 from the second stacks 11b of nanosheets 10a that are depicted in FIG. 8. Removing the second reacted layer 16 from the second stacks 11b of nanosheets 10a may include removing the sacrificial layer of the work function adjusting material 10b from both the first and second stacks of nanosheets 11a, 11b. This may include a selective etch process. In a following step, an etch mask (similar to the etch mask identified by reference number 14) is formed over the first stack 11a of nanosheets 10b. Thereafter, the process may continue with etching the second reacted layer 16 to remove it from the second stacks 11b of nanosheets 10a with a wet etch chemistry. In one embodiment, the etch process may include a chemistry of ozone, followed by dilute hydrofluoric acid (DHF). The first reacted layer 16 remains on the nanosheets 10a in the first stack 11a. The etch mask may be removed following removal of the second reacted layer 16.

The method may continue with forming a first gate structure 20a on the first stack 11a on nanosheets 10a and a second gate structure 20b on the second stack 11b of nanosheets 10a, wherein the first gate structure 20b includes a first interfacial oxide 17a including the work function adjusting material, and the second gate structure 20b includes a second interfacial oxide 17b that is free of the work function adjusting material. Treating the first reacted layer 16, and an exposed surface of the second stack 11b of nanosheets with an oxygen containing atmosphere to form the first and second interfacial oxide layers 17a, 17b has been described above with reference to FIG. 5. For example, the interfacial oxide 17b on the channel providing nanosheets 10a of the second stack 11b may be 100% silicon oxide ($SiO_2$). The composition of the interfacial oxide layer 17a that is present on the channel providing nanosheets 10a that include the reacted surface layer 16 in the first stack 11a include the work function adjusting elements that were introduced to the reacted surface layer 16 from the sacrificial nanosheet layer 10b. In some examples, the interfacial oxide layer 17a may be composed of a mix of germanium oxide ($GeO_2$) and silicon oxide and germanium oxide ($SiO_2$+$GeO_2$), in which the $GeO_2/(SiO_2+GeO_2)$ has an atomic % ranging from 25% to 75%. In one example, when the channel providing nanosheet 10a is silicon (Si), and the interfacial oxide layer 17a comprises silicon oxide (SiO2) intermixed with germanium (Ge), the work function adjusting elements in gate stack including a hafnium containing gate dielectric provides up to a 200 mV threshold voltage shift, i.e., when compared to a gate structure that does not include the work function adjusting elements, but is otherwise substantially identical.

Forming a gate dielectric 18a, 18b on the first and second interface oxide layers 17a, 17b for the first and second gate structures 20a, 20b; and forming a gate electrode 19a, 19b on the gate dielectric for the first and second gate structures. These steps have been described above with reference to FIGS. 6 and 7.

In another aspect, an electrical device is provided, e.g., nanosheet semiconductor device, that includes a stack 11a, 11b of nanosheets 10a, 10b comprised of a silicon containing semiconductor material, e.g., silicon (Si). Source and drain regions 13a, 13b are present on source and drain region portions of the stack 11a, 11b of nanosheets 10a, 10b. A gate structure 20a is present on a channel portion of the stack 11a of nanosheets 20a, the gate structure 20a including an interface oxide dielectric layer 17a that includes germanium (Ge) work function adjusting elements in combination with elements, such as silicon (Si) from a surface of the stack of nanosheets, wherein the germanium work function adjusting elements introduce a shift to the threshold voltage of the electrical device. In some examples, the interfacial oxide layer 17a may be composed of a mix of germanium oxide ($GeO_2$) and silicon oxide and germanium oxide ($SiO_2$+$GeO_2$), in which the $GeO_2/(SiO_2+GeO)$ has an atomic % ranging from 25% to 75%. The gate dielectric may be a high-k gate dielectric composed of hafnium, e.g., hafnium oxide ($HfO_2$). The germanium work function adjusting material produces up to a 200 mV shift in the threshold voltage of the electrical device. For example, the germanium work function adjusting material when integrated into the interfacial oxide layer 17a of a high threshold voltage nFET can provide an effective work function ranging from 4.25 eV to 4.55 eV. By comparison, a similar NFET without the germanium work function adjusting material can provide an effective work function ranging from 4.05 eV to 4.35 eV. For example, the germanium work function adjusting material when integrated into the interfacial oxide layer 17a of a low threshold voltage pFET can provide an effective work function ranging from 4.90 eV to 5.10 eV. By comparison, a similar PFET without the germanium work function adjusting material can provide an effective work function ranging from 4.70 eV to 4.90 eV. It is noted that the methods described with reference to FIGS. 1-9 can provide any combination of the aforementioned low threshold voltage pFET, regular threshold voltage pFET, high threshold voltage nFET, and/or regular threshold nFET simultaneously on a same supporting substrate.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device comprising:
    forming a stack of nanosheets composed of a semiconductor material;
    forming a sacrificial layer of a work function adjusting material including germanium on the semiconductor material of the stack of nanosheets;
    intermixing the work function adjusting material into the semiconductor material on at least a channel surface of nanosheets in said stack of nanosheets;
    removing the sacrificial layer of the work function adjusting material;
    forming an interfacial oxide including elements from the semiconductor material and the work function adjusting layer on said at least the channel surface of the stack of nanosheets; and
    forming a gate structure including a gate dielectric on the interfacial oxide that is present on the channel surface of the nanosheets;
    wherein the semiconductor material of the stack of nanosheets is a silicon containing material; and
    wherein the sacrificial layer of the work function adjusting material comprises silicon germanium containing material.

2. The method of claim 1, wherein the germanium content of the silicon germanium (SiGe) is greater than 35%.

3. The method of claim 1, wherein said intermixing the work function adjusting material into the semiconductor material on at least the channel surface of said nanosheets in said stack of nanosheets comprises thermal annealing.

4. The method of claim 1, wherein said removing the sacrificial layer of the work function adjusting material comprises an etch process that is selective to the semiconductor material of the stack of nanosheets.

5. The method of claim 1, where said forming the interfacial oxide including the elements from the semiconductor material and the work function adjusting layer comprised introducing the stack of nanosheets to an oxygen including atmosphere.

6. The method of claim 1, wherein the work function adjusting material produces up to a 200 mV shift in the threshold voltage of the semiconductor device.

* * * * *